(12) United States Patent
Mudda et al.

(10) Patent No.: US 12,706,789 B2
(45) Date of Patent: Aug. 11, 2026

(54) METHODS AND APPARATUS TO STRUCTURE ENVELOPE DETECTOR CIRCUITRY FOR ON-OFF KEYING MODULATION

(71) Applicant: Texas Instruments Incorporated, Dallas, TX (US)

(72) Inventors: Himanth Mudda, Kakinada (IN); Kumar Anurag Shrivastava, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 101 days.

(21) Appl. No.: 18/932,037

(22) Filed: Oct. 30, 2024

(65) Prior Publication Data

US 2026/0081812 A1 Mar. 19, 2026

(51) Int. Cl.

*H04L 27/04* (2006.01)
*H02M 7/217* (2006.01)
*H04B 1/40* (2015.01)
*H03F 1/02* (2006.01)

(52) U.S. Cl.

CPC ............ *H04L 27/04* (2013.01); *H02M 7/217* (2013.01); *H04B 1/40* (2013.01); *H03F 1/0238* (2013.01)

(58) Field of Classification Search

CPC ........................................................ H04L 27/04
USPC .......................................................... 329/369
See application file for complete search history.

(56) References Cited

U.S. PATENT DOCUMENTS

| | | | | |
|---|---|---|---|---|
| 4,194,240 A * | 3/1980 | Davis | H02M 7/217 | 327/104 |
| 4,890,066 A * | 12/1989 | Straver | H03D 1/10 | 329/349 |
| 2011/0134674 A1* | 6/2011 | Ivanov | H02M 7/219 | 363/127 |
| 2013/0062962 A1* | 3/2013 | Xue | H01F 38/14 | 307/104 |
| 2015/0256102 A1* | 9/2015 | Tang | H02M 7/219 | 363/89 |
| 2016/0072481 A1* | 3/2016 | Seth | H03K 3/012 | 327/531 |
| 2022/0329207 A1* | 10/2022 | Spina | H03F 3/19 | |
| 2023/0025757 A1* | 1/2023 | Manikandan | H03K 19/0175 | |
| 2023/0308323 A1* | 9/2023 | Shrivastava | H03C 1/36 | |

* cited by examiner

*Primary Examiner* — Joseph Chang
(74) *Attorney, Agent, or Firm* — Xianghui Huang; Frank D. Cimino

(57) ABSTRACT

An example apparatus includes: rectifier circuitry including: a first resistor having a terminal; a second resistor having a terminal; a first transistor having a first terminal, a second terminal, and a control terminal; and a second transistor having a first terminal, a second terminal, and a control terminal; reference circuitry having a first input, a second input, a third input, a fourth input, and an output, the first input of the reference circuitry coupled to the control terminal of the first transistor, the second input of the reference circuitry coupled to the terminal of the second resistor and first terminal of the second transistor, the third input of the reference circuitry coupled to the control terminal of the second transistor, the fourth input of the reference circuitry coupled to the terminal of the first resistor and the first terminal of the first transistor.

21 Claims, 7 Drawing Sheets

600
610
620
630
635
640
650
660
670
0.0
5.0
10.0
15.0
20.0
25.0
30.0
35.0
40.0
45.0
50.0
TIME (ns)

700
VOUT
VREF
VOUT_AVG
VREF_AVG
710
720
730
740
750
760
0.0
5.0
10.0
15.0
20.0
25.0
30.0
35.0
40.0
45.0
50.0
TIME (ns)

METHODS AND APPARATUS TO STRUCTURE ENVELOPE DETECTOR CIRCUITRY FOR ON-OFF KEYING MODULATION

CROSS REFERENCE TO RELATED APPLICATION

This patent application claims the benefit of and priority to Indian Provisional Patent Application No. 202441069427 filed Sep. 13, 2024, which is hereby incorporated herein by reference in its entirety.

TECHNICAL FIELD

This description relates generally to envelop detectors and, more particularly, to methods and apparatus to structure envelope detector circuitry for on-off keying modulation.

BACKGROUND

Isolators (e.g., galvanic isolators, capacitive isolators, inductive isolators, and optical isolators) are commonly used to isolate circuits operating at one voltage from circuits operating at a different voltage. Digital isolators receive a digital signal that is used to modulate an analog signal to create a modulated signal capable of traversing a transformer, which isolates a transmit side from a receive side. As such, digital isolators include circuitry to demodulate the modulated signal after the modulated signal traverses the isolating transformer. Isolators utilizing on-off keying (OOK) modulation include a receive side including envelope detector circuitry to construct a digital output signal by demodulating the modulated signal.

SUMMARY

For methods and apparatus to structure envelope detector circuitry for on-off keying modulation, an example apparatus includes rectifier circuitry including: a first resistor having a terminal; a second resistor having a terminal; a first transistor having a first terminal, a second terminal, and a control terminal; and a second transistor having a first terminal, a second terminal, and a control terminal; reference circuitry having a first input, a second input, a third input, a fourth input, and an output, the first input of the reference circuitry coupled to the control terminal of the first transistor, the second input of the reference circuitry coupled to the terminal of the second resistor and first terminal of the second transistor, the third input of the reference circuitry coupled to the control terminal of the second transistor, the fourth input of the reference circuitry coupled to the terminal of the first resistor and the first terminal of the first transistor; and comparator circuitry having a first input and a second input, the first input of the comparator circuitry coupled to the second terminal of the first transistor and the second terminal of the second transistor, the second input of the comparator circuitry coupled to the output of the reference circuitry. Other examples are described.

For methods and apparatus to structure envelope detector circuitry for on-off keying modulation, an example apparatus includes rectifier circuitry having a first output, a second output, a third output, a fourth output, and a fifth output; reference circuitry including: current source circuitry having a terminal; a first transistor having a first terminal, a second terminal, and a control terminal, the first terminal of the first transistor coupled to the first output of the rectifier circuitry, the control terminal of the first transistor coupled to the second output of the rectifier circuitry; and a second transistor having a first terminal, a second terminal, and a control terminal, the first terminal of the second transistor coupled to the third output of the rectifier circuitry, the control terminal of the second transistor coupled to the fourth output of the rectifier circuitry; and comparator circuitry having a first input and a second input, the first input of the comparator circuitry coupled to the fifth output of the rectifier circuitry, the second input of the comparator circuitry coupled to the terminal of the current source circuitry, the second terminal of the first transistor, and the second terminal of the second transistor. Other examples are described.

For methods and apparatus to structure envelope detector circuitry for on-off keying modulation, an example apparatus includes transmitter circuitry having a first output and a second output; transformer circuitry having a first terminal, a second terminal, a third terminal, and a fourth terminal, the first terminal of the transformer circuitry coupled to the first output of the transmitter circuitry, the second terminal of the transformer circuitry coupled to the second output of the transmitter circuitry; and receiver circuitry including: rectifier circuitry having a first input, a second input, a first output, a second output, and a third output, the first input of the rectifier circuitry coupled to the third terminal of the transformer circuitry, the second input of the rectifier circuitry coupled to the fourth terminal of the rectifier circuitry; and reference circuitry having a first input, a second input, and an output, the first input of the reference circuitry coupled to the first output of the rectifier circuitry, the second input of the reference circuitry coupled to the second output of the rectifier circuitry; and comparator circuitry having a first input and a second input, the first input of the comparator circuitry coupled to the third output of the rectifier circuitry, the second input of the comparator circuitry coupled to the output of the reference circuitry. Other examples are described.

Figure 1:
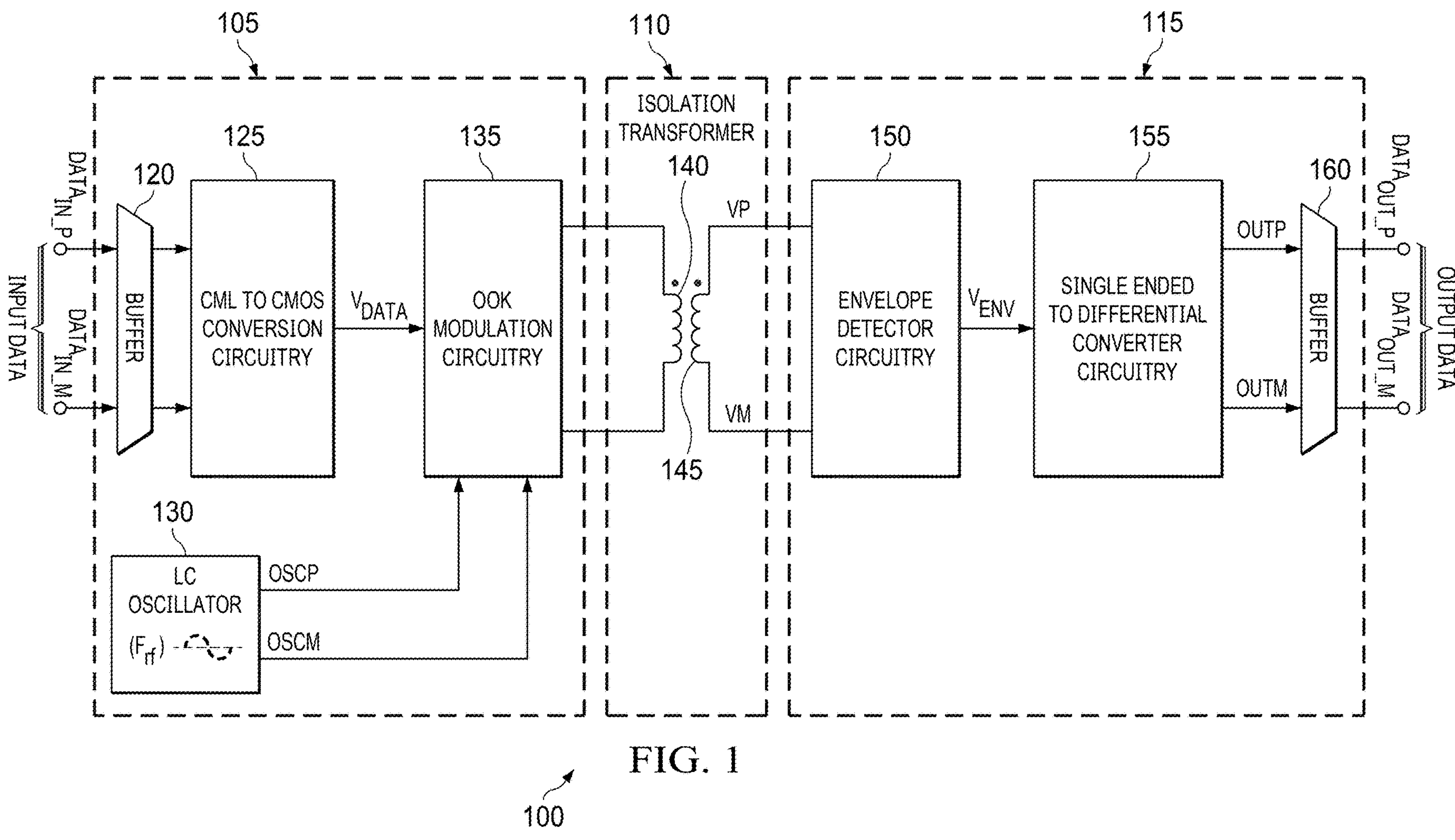
FIG. 1 is a block diagram of an example digital isolator system including example transmitter circuitry, an example isolation transformer, and example receiver circuitry further including example envelope detector circuitry.

The drawings are not necessarily to scale. Generally, the same reference numbers in the drawing(s) and this description refer to the same or similar (functionally and/or structurally) features and/or parts. Although the drawings show regions with clean lines and boundaries, some or all of these lines and boundaries may be idealized. In reality, the boundaries or lines may be unobservable, blended or irregular.

DETAILED DESCRIPTION

Isolators (e.g., galvanic isolators, capacitive isolators, inductive isolators, and optical isolators) are commonly used to isolate circuits operating at one voltage from circuits operating at a different voltage. Digital isolators receive a digital signal that is used to modulate an analog signal to create a modulated signal capable of traversing a transformer, which isolates a transmit side from a receive side. As such, digital isolators include circuitry to demodulate the modulated signal after the modulated signal traverses the isolating transformer. Isolators utilizing on-off keying (OOK) modulation include a receive side including envelope detector circuitry to construct a digital output signal by demodulating the modulated signal.

Some isolator systems include transmitter circuitry, transformer circuitry, and receiver circuitry. The transmitter circuitry further includes modulation circuitry, which produces a modulated output signal responsive to a digital input signal. OOK modulation circuitry controls the propagation of a sinusoidal carrier signal through the transformer circuitry to transmit data of the digital input signal. In operation, the OOK modulation circuitry allows the sinusoidal carrier signal to propagate through the transformer circuitry responsive to the digital input signal being a logic one (i.e., the transmitter is "on"). In such operations, the OOK modulation circuitry prevents the sinusoidal carrier signal from propagating through the transformer circuitry responsive to the digital input signal being a logic zero (i.e., the transmitter is "off").

The transformer circuitry couples the transmitter circuitry to the receiver circuitry across an isolation barrier. In some systems, the core of the transformer circuitry may be considered the isolation barrier. Isolator systems using transformer circuitry to isolate the transmitter circuitry from the receiver circuitry is considered an inductive isolator. The transformer circuitry prevents exposing the transmitter circuitry to voltages of the receiver circuitry and vice versa. The receiver circuitry includes demodulation circuitry, which constructs a digital output signal responsive to demodulating a received modulated signal from the transformer circuitry.

Envelope detector circuitry is a type of demodulation circuitry structured to demodulate signals produced using OOK modulation. Some envelope detector circuitry includes rectifier circuitry, bias circuitry, reference circuitry, and comparator circuitry. The rectifier circuitry generates an output voltage responsive to rectifying the modulated signal with a pair of transistors. The bias circuitry controls the current conduction of the pair of transistors when the modulated signal represents logic zeros (e.g., no carrier signal is traversing the transformer circuitry). The reference circuitry generates a reference voltage responsive to a bias voltage from the bias circuitry. The comparator circuitry subtracts the output voltage from the reference voltage to produce a comparison voltage. The comparator circuitry generates a digital output signal responsive to a comparison of a threshold voltage to the comparison voltage.

In operation, the envelope detector circuitry sets the digital output signal to a logic one responsive to the modulated signal driving the pair of transistors of the rectifier circuitry. However, in some operations, a shift in the common mode voltage of the modulated signal on either the transmit side or the receive side of the transformer circuitry may result in the pair of transistors continuing to conduct current when the carrier signal is not being supplied. Some isolator systems reduce the likelihood of common mode voltage errors by center tapping the transformer circuitry to a common potential. In such systems, both the receive and transmit sides of the transformer circuitry require additional connections to the common potential of the transmitter circuitry or the receiver circuitry. Further, the center tap effectively separates the inductances on both sides into two separate inductors, which increases the likelihood of errors resulting from mismatch. Such a method of reducing common mode errors by center tapping the transformer circuitry increases the system-on-chip size and complexity of implementing the isolator system.

Examples described herein include methods and apparatus to structure envelope detector circuitry for on-off keying modulation to improve common mode rejection ratio (CMRR). In some examples, the envelope detector circuitry includes rectifier circuitry, bias circuitry, reference circuitry, and comparator circuitry. The envelope detector circuitry receives a plus modulated signal and a minus modulated signal as a differential pair of signals representing a modulated signal. The rectifier circuitry further has a first transistor, a first resistor, a second transistor, and a second resistor. The first transistor conducts current responsive to a subtraction of the minus modulated signal from the plus modulated signal. The first resistor sets the source voltage of the first transistor and the output voltage responsive to current from the first transistor. Similarly, the second transistor conducts current responsive to a subtraction of the plus modulated signal from the minus modulated signal. The second resistor sets the source voltage of the second transistor and the output voltage responsive to current from the second transistor. The bias circuitry biases the control terminals of the first and second transistors of the rectifier circuitry using a bias voltage. The first and second transistors conduct a bias current responsive to the bias voltage.

In such described examples, the reference circuitry includes a third transistor and a fourth transistor. The third transistor conducts current based on the difference between a control voltage of the first transistor and the source voltage of the second transistor of the rectifier circuitry. The fourth transistor conducts current based on the difference between the control voltage of the second transistor and the source voltage of the first transistor. In operation, the third transistor conducts less current responsive to the second resistor increasing the source voltage of the second transistor during conduction of the second transistor. Similarly, the fourth transistor conducts less current responsive to the first resistor increasing the source voltage of the first transistor during conduction of the first transistor. The third and fourth transistors adjust the reference voltage based on the conduction of the first and second transistors of the rectifier circuitry.

Advantageously, the third and fourth transistors of the reference circuitry track changes in the first and second transistors of the rectifier circuitry. Advantageously, the reference circuitry adjusts the reference voltage responsive to changes in the common mode voltage of the plus and minus modulated signals. Advantageously, the first and fourth transistors may be implemented in a shared die region responsive to having common source voltages. Advantageously, the second and third transistors may be implemented in a shared die region responsive to having common source voltages. Advantageously, structing the reference circuitry to have transistors that can be implemented in the existing die regions of the rectifier circuitry reduces the SoC size and complexity.

FIG. 1 is a block diagram of an example digital isolator system 100 including example transmitter circuitry 105, an example isolation transformer 110, and example receiver circuitry 115. The example transmitter circuitry 105 of FIG. 1 includes an example buffer 120, example current mode logic (CML) to complementary metal oxide semiconductor (CMOS) conversion circuitry 125, example inductor-capacitor (LC) oscillator circuitry 130, and example OOK modulation circuitry 135. The example isolation transformer 110 of FIG. 1 includes a first example inductor 140 and a second inductor 145. The example receiver circuitry 115 of FIG. 1 includes example envelope detector circuitry 150, example single ended to differential (S2D) converter circuitry 155, and an example buffer 160.

The digital isolator system 100 has a first input, a second input, a first output, and a second output. The first input of the digital isolator system 100 is structured to be coupled to external circuitry (also referred to as upstream circuitry), which supplies a plus input signal ($DATA_{IN\_P}$). The second input of the digital isolator system 100 is structured to be coupled to external circuitry (also referred to as upstream circuitry), which supplies a minus input signal ($DATA_{IN\_M}$). The plus and minus input signals form a differential pair of signals that represent an input data signal. In the example of FIG. 1, the input data signal is a digital signal. The first output of the digital isolator system 100 is structured to be coupled to external circuitry (also referred to as downstream circuitry), which receives a plus output signal ($DATA_{OUT\_P}$). The second output of the digital isolator system 100 is structured to be coupled to external circuitry (also referred to as downstream circuitry), which receives a minus output signal ($DATA_{OUT\_M}$). The plus and minus output signals form a differential pair of signals that represent an output data signal. In the example of FIG. 1, the output data signal is a digital signal.

The transmitter circuitry 105 has a first terminal, a second terminal, a third terminal, and a fourth terminal. The first terminal of the transmitter circuitry 105 is coupled to the first input of the digital isolator system 100, which supplies the plus input signal. The second terminal of the transmitter circuitry 105 is coupled to the second input of the digital isolator system 100, which supplies the minus side input signal. The third and fourth terminals of the transmitter circuitry 105 are coupled to the isolation transformer 110.

The isolation transformer 110 has a first terminal, a second terminal, a third terminal and a fourth terminal. The first and second terminals of the isolation transformer 110 are coupled to the transmitter circuitry 105. The third and fourth terminals of the isolation transformer 110 are coupled to the receiver circuitry 115. In some examples, the isolation transformer 110 is illustrated or described as a transformer, transformer circuitry, or having an isolation barrier.

The receiver circuitry 115 has a first terminal, a second terminal, a third terminal, and a fourth terminal. The first and second terminals of the receiver circuitry 115 are coupled to the isolation transformer 110. The third terminal of the receiver circuitry 115 is coupled to the first output of the digital isolator system 100. The fourth terminal of the receiver circuitry 115 is coupled to the second output of the digital isolator system 100.

The buffer 120 has a first terminal, a second terminal, a third terminal, and a fourth terminal. The first terminal of the buffer 120 is coupled to the first input of the digital isolator system 100, which supplies the plus input signal. The second terminal of the buffer 120 is coupled to the second input of the digital isolator system 100, which supplies the minus input signal. The third and fourth terminals of the buffer 120 are coupled to the CML to CMOS conversion circuitry 125.

The CML to CMOS conversion circuitry 125 has a first terminal, a second terminal, and a third terminal. The first and second terminals of the CML to CMOS conversion circuitry 125 are coupled to the buffer 120. The third terminal of the CML to CMOS conversion circuitry 125 is coupled to the OOK modulation circuitry 135.

The LC oscillator circuitry 130 has a first terminal and a second terminal. The first terminal of the LC oscillator circuitry 130 is coupled to the OOK modulation circuitry 135. The second terminal of the LC oscillator circuitry 130 is coupled to the OOK modulation circuitry 135. In the example of FIG. 1, the LC oscillator circuitry 130 is an inductor-capacitor oscillator. Alternatively, the LC oscillator circuitry 130 may be an alternative type of oscillator or integrated into the OOK modulation circuitry 135.

The OOK modulation circuitry 135 has a first terminal, a second terminal, a third terminal, a fourth terminal, and a fifth terminal. The first terminal of the OOK modulation circuitry 135 is coupled to the CML to CMOS conversion circuitry 125. The second and third terminals of the OOK modulation circuitry 135 are coupled to the LC oscillator circuitry 130. The fourth and fifth terminals of the OOK modulation circuitry 135 are coupled to the inductor 140 or more generally the isolation transformer 110.

The inductor 140 has a first terminal and a second terminal. The first and second terminals of the inductor 140 are coupled to the OOK modulation circuitry 135 or more generally the transmitter circuitry 105. The inductor 140 is structured to be magnetically coupled to the inductor 145.

The inductor 145 has a first terminal and a second terminal. The first and second terminals of the inductor 145 are coupled to the envelope detector circuitry 150 or more generally, to the receiver circuitry 115. The inductor 145 is structured to be magnetically coupled to the inductor 140. In some examples, the inductors 140, 145 are magnetically coupled by a core. Advantageously, magnetically coupling the inductors 140, 145 electrically isolates voltages of the transmitter circuitry 105 from voltages of the receiver circuitry 115 and vice versa.

The envelope detector circuitry 150 has a first terminal, a second terminal, and a third terminal. The first and second terminals of the envelope detector circuitry 150 are coupled to the inductor 145. The third terminal of the envelope detector circuitry 150 is coupled to the S2D converter circuitry 155. Examples of the envelope detector circuitry 150 are further illustrated and described in connection with FIGS. 2 and 3.

The S2D converter circuitry 155 has a first terminal, a second terminal, and a third terminal. The first terminal of the S2D converter circuitry 155 is coupled to the envelope detector circuitry 150. The second and third terminals of the S2D converter circuitry 155 are coupled to the buffer 160.

The buffer 160 has a first terminal, a second terminal, a third terminal, and a fourth terminal. The first and second terminals of the buffer 160 are coupled to the S2D converter circuitry 155. The third terminal of the buffer 160 is coupled to the first output of the digital isolator system 100. The fourth terminal of the buffer 160 is coupled to the second output of the digital isolator system 100.

In example operations, the buffer 120 buffers the plus and minus input signals. The CML to CMOS conversion circuitry 125 generates a data voltage signal ($V_{DATA}$) responsive to the plus and minus input signals from the buffer 120. In the example of FIG. 1, the data voltage signal represents data of the plus and minus input signals using CMOS logic. The OOK modulation circuitry 135 receives plus and minus carrier signals (OSCP, OSCM) from the LC oscillator circuitry 130 and the data voltage signal from the CML to CMOS conversion circuitry 125. The OOK modulation circuitry 135 drives the inductor 140 using the carrier signal responsive to the data voltage signal having a first state (e.g., logic one, logical high, etc.). The OOK modulation circuitry 135 prevents the carrier signal from driving the inductor 140 responsive to the data voltage signal having a second state (e.g., logic zero, logical low, etc.). The inductor 140 induces current to flow through the inductor 145 responsive to the carrier signal. The inductor 145 produces plus and minus receive signals (VP, VM) based on the induction of current by the inductors 140, 145.

In example operations, the envelop detector circuitry 150 produces an envelope voltage signal ($V_{ENV}$) responsive to demodulating the plus and minus receive signals. The envelope voltage signal is a digital signal representing the demodulated plus and minus receive signals. Example operations of the envelope detector circuitry 150 are further illustrated and described in connection with FIGS. 2, 3, and 5. Advantageously, the envelope detector circuitry 150 increases CMRR of the digital isolator system 100 by producing a reference voltage that tracks the common mode voltage of the plus and minus receive signals. In such example operations, the S2D converter circuitry 155 produces plus and minus output signals (OUTP, OUTM) responsive to the single ended envelope voltage signal. The buffer 160 supplies the plus and minus output signals to downstream circuitry.

Figure 2:
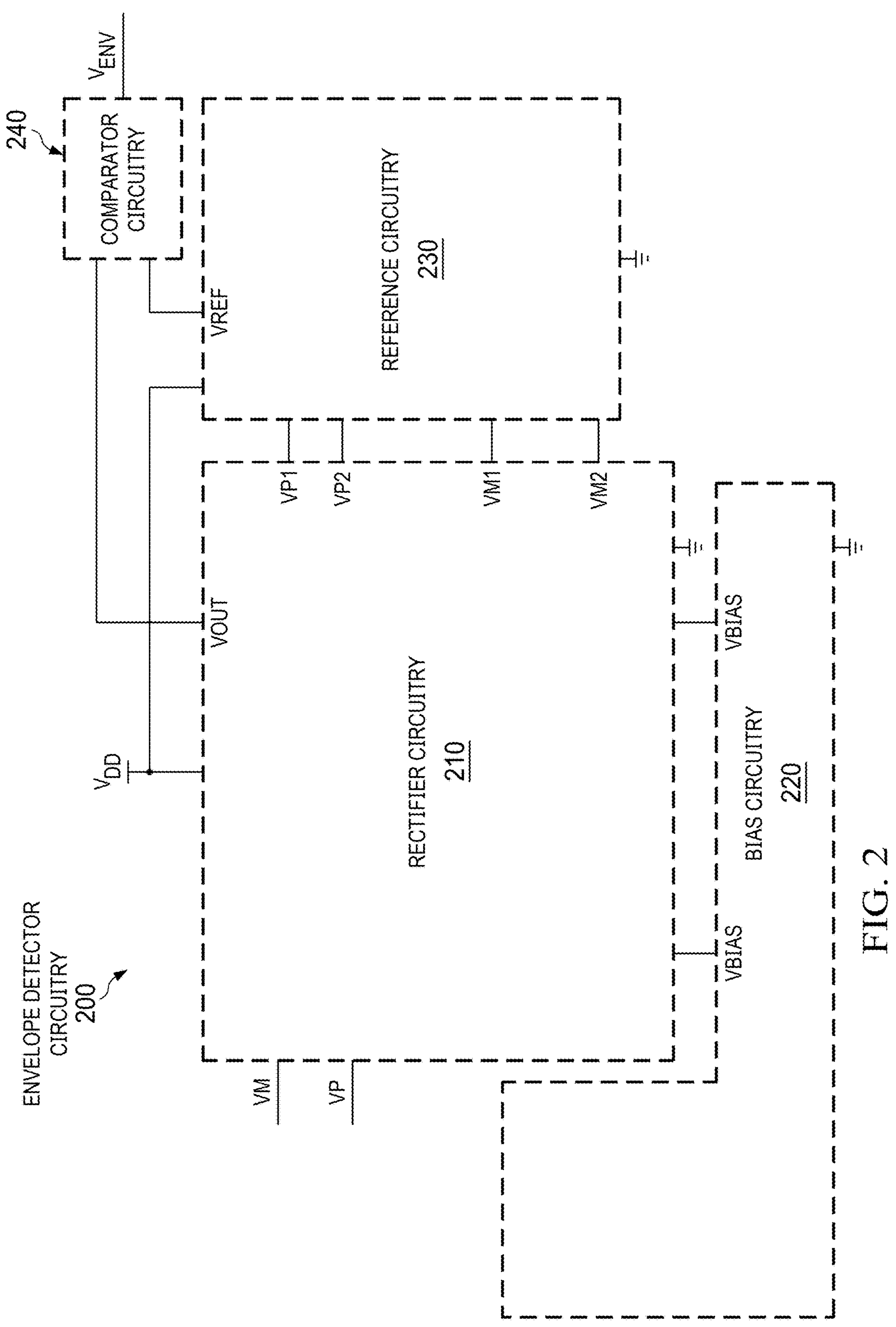
FIG. 2 is a block diagram of an example of the envelope detector circuitry of FIG. 1.

FIG. 2 is a block diagram of example envelope detector circuitry 200, which is an example of the envelope detector circuitry 150 of FIG. 1. The example envelope detector circuitry 200 of FIG. 2 includes example rectifier circuitry 210, example bias circuitry 220, example reference circuitry 230, and example comparator circuitry 240. The envelope detector circuitry 200 has a first input, a second input, and an output. The first input of the envelope detector circuitry 200 is structured to be coupled to the isolation transformer 110 of FIG. 1, which supplies a plus receive signal (VP). The second input of the envelope detector circuitry 200 is structured to be coupled to the isolation transformer 110 of FIG. 1, which supplies a minus receive signal (VM). The output of the envelope detector circuitry 200 is structured to be coupled to the S2D converter circuitry 155 of FIG. 1, which receives an envelope voltage signal ($V_{ENV}$). In the example of FIG. 2, the envelope voltage signal represents a single ended digital signal.

The rectifier circuitry 210 has a first terminal, a second terminal, a third terminal, a fourth terminal, a fifth terminal, a sixth terminal, a seventh terminal, an eighth terminal, a ninth terminal, a tenth terminal and an eleventh terminal. The first terminal of the rectifier circuitry 210 is coupled to the first input of the envelope detector circuitry 200, which supplies the plus receive signal. The second terminal of the rectifier circuitry 210 is coupled to the second input of the envelope detector circuitry 200, which supplies the minus receive signal. The third and fourth terminals of the rectifier circuitry 210 are coupled to the bias circuitry 220. The fifth, sixth, seventh, and eighth terminals of the rectifier circuitry 210 are coupled to the reference circuitry 230. The ninth terminal of the rectifier circuitry 210 is coupled to the comparator circuitry 240. The tenth terminal of the rectifier circuitry 210 is coupled to a supply terminal, which supplies a supply voltage ($V_{DD}$). The eleventh terminal of the rectifier circuitry 210 is coupled to a common terminal, which supplies a common potential (e.g., ground, AVSS, $V_{SS}$, etc.). An example of the rectifier circuitry 210 is further illustrated and described in connection with FIG. 3.

The bias circuitry 220 has a first terminal, a second terminal, and a third terminal. The first and second terminals of the bias circuitry 220 are coupled to the rectifier circuitry 210. The third terminal of the bias circuitry 220 is coupled to the common terminal, which supplies the common potential. An example of the bias circuitry 220 is further illustrated and described in connection with FIG. 3.

The reference circuitry 230 has a first terminal, a second terminal, a third terminal, a fourth terminal, a fifth terminal, a sixth terminal, and a seventh terminal. The first, second, third, and fourth terminals of the reference circuitry 230 are coupled to the rectifier circuitry 210. The fifth terminal of the reference circuitry 230 is coupled to the comparator circuitry 240. The sixth terminal of the reference circuitry 230 is coupled to the supply terminal, which supplies the supply voltage. The seventh terminal of the reference circuitry 230 is coupled to the common terminal, which supplies the common potential. An example of the reference circuitry 230 is further illustrated and described in connection with FIG. 3.

The comparator circuitry 240 has a first terminal, a second terminal, and a third terminal. The first terminal of the comparator circuitry 240 is coupled to the rectifier circuitry 210. The second terminal of the comparator circuitry 240 is coupled to the reference circuitry 230. The third terminal of the comparator circuitry 240 is coupled to the output of the envelope detector circuitry 200. An example of the comparator circuitry 240 is further illustrated and described in connection with FIG. 3.

Figure 3:
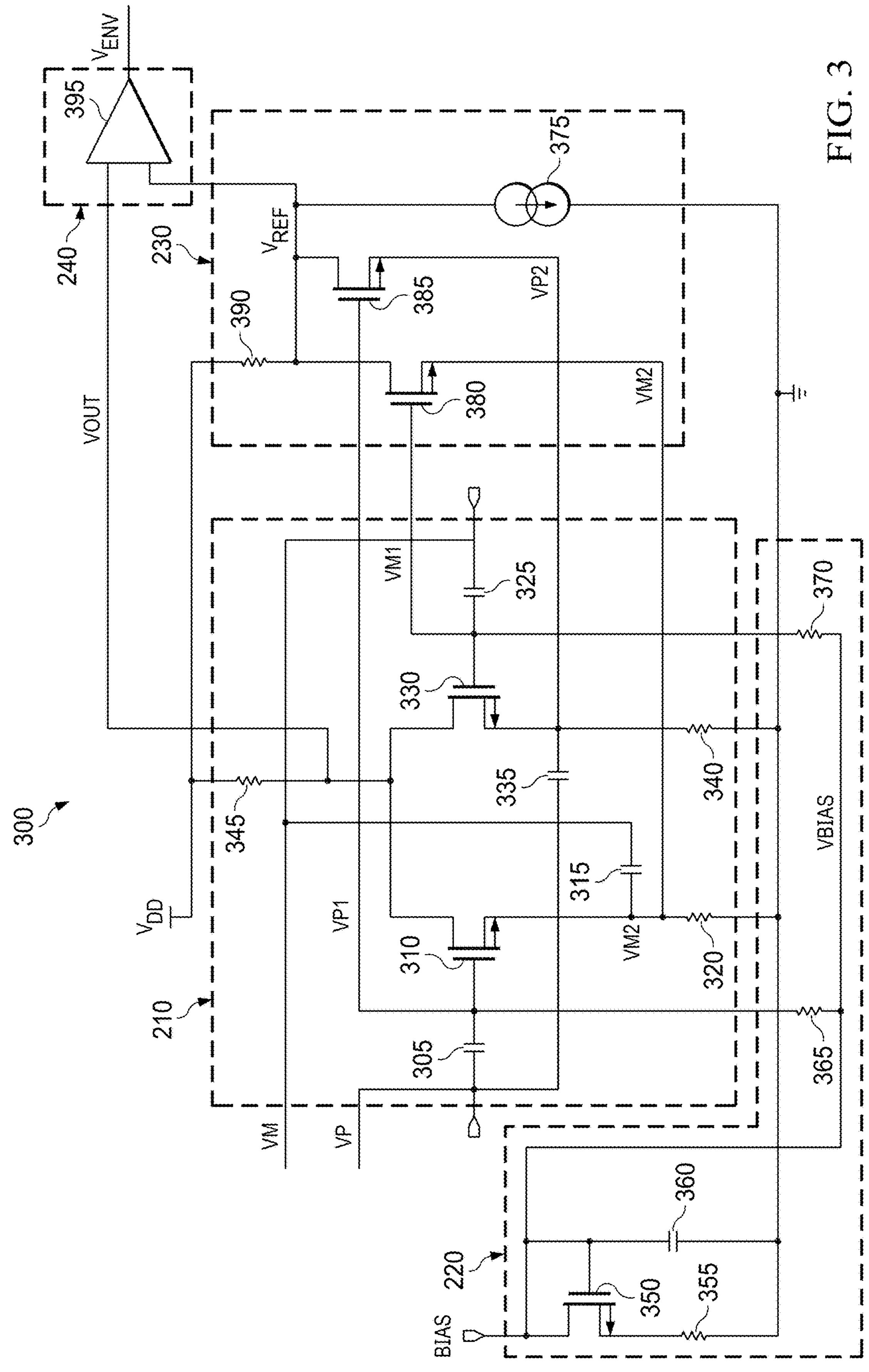
FIG. 3 is a schematic diagram of an example of the envelope detector circuitry of FIGS. 1 and 2 including example rectifier circuitry and example reference circuitry.

FIG. 3 is a schematic diagram of example envelope detector circuitry 300, which is an example of the envelope detector circuitry 150, 200 of FIGS. 1 and 2. In the example of FIG. 3, the envelope detector circuitry 300 includes the rectifier circuitry 210 of FIG. 2, the bias circuitry 220 of FIG. 2, the reference circuitry 230 of FIG. 2, and the comparator circuitry 240 of FIG. 2. The example rectifier circuitry 210 of FIG. 3 includes a first example capacitor 305, a first example transistor 310, a second example capacitor 315, a first example resistor 320, a third example capacitor 325, a second example transistor 330, a fourth example capacitor 335, a second example resistor 340, and a third example resistor 345. The example bias circuitry 220 of FIG. 3 includes an example transistor 350, a first example resistor 355, an example capacitor 360, a second example resistor 365, and a third example resistor 370. The example reference circuitry 230 of FIG. 3 includes example current source circuitry 375, a first example transistor 380, a second example transistor 385, and an example resistor 390. The example comparator circuitry 240 of FIG. 3 includes an example amplifier 395.

The envelope detector circuitry 300 has a first input, a second input, and an output. The first input of the envelope detector circuitry 300 is structured to be coupled to the isolation transformer 110 of FIG. 1, which supplies a plus receive signal (VP). The second input of the envelope detector circuitry 300 is structured to be coupled to the isolation transformer 110 of FIG. 1, which supplies a minus receive signal (VM). The output of the envelope detector circuitry 300 is structured to be coupled to the S2D converter circuitry 155 of FIG. 1, which receives an envelope voltage signal ($V_{ENV}$). In the example of FIG. 2, the envelope voltage signal represents a single ended digital signal.

The rectifier circuitry 210 has a first input, a second input, a third input, a fourth input, a first output, a second output, a third output, a fourth output, and a fifth output. The first input of the rectifier circuitry 210 is coupled to the first input of the envelope detector circuitry 300, which supplies the plus receive signal. The second input of the rectifier circuitry 210 is coupled to the second input of the envelope detector circuitry 300, which supplies the minus receive signal. The third and fourth inputs of the rectifier circuitry 210 are coupled to the bias circuitry 220, which supplies a bias voltage (VBIAS). The first, second, third, and fourth outputs of the rectifier circuitry 210 are coupled to the reference circuitry 230, which receives first and second positive drive voltages (VP1, VP2) and first and second minus drive voltages (VM1, VM2). The fifth output of the rectifier circuitry 210 is coupled to the comparator circuitry 240, which receives an output voltage (VOUT). In the example of FIG. 3, rectifier circuitry 210 is an example implementation of the rectifier circuitry 210 of FIG. 2.

The bias circuitry 220 has an input, a first output, and a second output. The input of the bias circuitry 220 is coupled to a bias terminal, which supplies a bias current (BIAS). The first and second outputs of the bias circuitry 220 are coupled to the rectifier circuitry 210 and the reference circuitry 230. In the example of FIG. 3, the bias circuitry 220 is an example implementation of the bias circuitry 220 of FIG. 2.

The reference circuitry 230 has a first input, a second input, a third input, a fourth input, and an output. The first, second, third, and fourth inputs of the reference circuitry 230 are coupled to the rectifier circuitry 210, which supplies the first and second positive drive voltages and the first and second minus drive voltages. The output of the reference circuitry 230 is coupled to the comparator circuitry 240, which receives a reference voltage ($V_{REF}$). In the example of FIG. 3, the reference circuitry 230 is an example implementation of the reference circuitry 230 of FIG. 2.

The comparator circuitry 240 has a first input, a second input, and an output. The first input of the comparator circuitry 240 is coupled to the rectifier circuitry 210, which supplies the output voltage. The second input of the comparator circuitry 240 is coupled to the reference circuitry 230, which supplies the reference voltage. The output of the comparator circuitry 240 is coupled to the output of the envelope detector circuitry 300, which supplies the envelope voltage signal. In the example of FIG. 3, the comparator circuitry 240 is an example implementation of the comparator circuitry 240 of FIG. 2.

The capacitor 305 has a first terminal and a second terminal. The first terminal of the capacitor 305 is coupled to the capacitor 335 and the first input of the envelope detector circuitry 300, which supplies the plus receive signal. The second terminal of the capacitor 305 is coupled to the transistors 310, 385 and the resistor 365.

The transistor 310 has a first terminal, a second terminal, a third terminal, and a control terminal. The first terminal of the transistor 310 is coupled to the transistor 330, the resistor 345, and the amplifier 395. The second and third terminals of the transistor 310 are coupled to the capacitor 315, the resistor 320, and the transistor 380. In some examples, the third terminal of the transistor 310 is referred to as a bulk terminal. The control terminal of the transistor 310 is coupled to the capacitor 305, the transistor 385, and the resistor 365.

The capacitor 315 has a first terminal and a second terminal. The first terminal of the capacitor 315 is coupled to the capacitor 325 and the second input of the envelope detector circuitry 300, which supplies the minus receiver voltage. The second terminal of the capacitor 315 is coupled to the transistors 310, 380 and the resistor 320.

The resistor 320 has a first terminal and a second terminal. The first terminal of the resistor 320 is coupled to the transistors 310, 380 and the capacitor 315. The second terminal of the resistor 320 is coupled to the common terminal, which supplies the common potential.

The capacitor 325 has a first terminal and a second terminal. The first terminal of the capacitor 325 is coupled to the capacitor 315 and the second input of the envelope detector circuitry 300, which supplies the minus receive signal. The second terminal of the capacitor 325 is coupled to the transistors 330, 380 and the resistor 370.

The transistor 330 has a first terminal, a second terminal, a third terminal, and a control terminal. The first terminal of the transistor 330 is coupled to the transistor 310, the resistor 345, and the amplifier 395. The second and third terminals of the transistor 330 are coupled to the capacitor 335, the resistor 370, and the transistor 385. In some examples, the third terminal of the transistor 330 is referred to as a bulk terminal. The control terminal of the transistor 330 is coupled to the capacitor 325, the resistor 370, and the transistor 380.

The capacitor 335 has a first terminal and a second terminal. The first terminal of the capacitor 335 is coupled to the capacitor 305 and the first input of the envelope detector circuitry 300, which supplies the plus receive signal. The second terminal of the capacitor 335 is coupled to the transistors 330, 385 and the resistor 340.

The resistor 340 has a first terminal and a second terminal. The first terminal of the resistor 340 is coupled to transistors 330, 385 and the capacitor 335. The second terminal of the resistor 340 is coupled to the common terminal, which supplies the common potential.

The resistor 345 has a first terminal and a second terminal. The first terminal of the resistor 345 is coupled to the supply terminal, which supplies a supply voltage. The second terminal of the resistor 345 is coupled to the transistors 310, 330 and the amplifier 395.

The transistor 350 has a first terminal, a second terminal, a third terminal, and a control terminal. The first and control terminals of the transistor 350 are coupled to the capacitor 360, the resistors 365, 370, and the bias terminal, which supplies the bias current. The second and third terminals of the transistor 350 are coupled to the resistor 355.

The resistor 355 has a first terminal and a second terminal. The first terminal of the resistor 355 is coupled to the transistor 350. The second terminal of the resistor 355 is coupled to the common terminal, which supplies the common potential.

The capacitor 360 has a first terminal and a second terminal. The first terminal of the capacitor 360 is coupled to the transistor 350, the resistors 365, 370, and the bias terminal, which supplies the bias current. The second terminal of the capacitor 360 is coupled to the common terminal, which supplies the common potential.

The resistor 365 has a first terminal and a second terminal. The first terminal of the resistor 365 is coupled to the capacitor 305 and the transistors 310, 385. The second terminal of the resistor 365 is coupled to the transistor 350, the capacitor 360, the resistor 370, and the bias terminal, which supplies the bias current.

The resistor 370 has a first terminal and a second terminal. The first terminal of the resistor 370 is coupled to the capacitor 325 and the transistors 330, 380. The second terminal of the resistor 370 is coupled to the transistor 350, the capacitor 360, the resistor 365, and the bias terminal, which supplies the bias current.

The current source circuitry 375 has a first terminal and a second terminal. The first terminal of the current source circuitry 375 is coupled to the transistors 380, 385, the resistor 390, and the amplifier 395. The second terminal of the current source circuitry 375 is coupled to the common terminal, which supplies the common potential.

The transistor 380 has a first terminal, a second terminal, a third terminal, and a control terminal. The first terminal of the transistor 380 is coupled to the current source circuitry 375, the transistor 385, the resistor 390, and the amplifier 395. The second and third terminals of the transistor 380 are coupled to the transistor 310, the capacitor 315, and the resistor 320. In some examples, the third terminal of the transistor 380 is referred to as a bulk terminal. The control terminal of the transistor 380 is coupled to the capacitor 325, the transistor 330, and the resistor 370.

The transistor 385 has a first terminal, a second terminal, a third terminal, and a control terminal. The first terminal of the transistor 385 is coupled to the current source circuitry 375, the transistor 380, the resistor 390, and the amplifier 395. The second and third terminals of the transistor 385 are coupled to transistor 330, the capacitor 335, and the resistor 340. The control terminal of the transistor 385 is coupled to the capacitor 305, the transistor 310, and the resistor 365.

The resistor 390 has a first terminal and a second terminal. The first terminal of the resistor 390 is coupled to the supply terminal, which supplies the supply voltage. The second terminal of the resistor 390 is coupled to the current source circuitry 375, the transistors 380, 385, and the amplifier 395.

The amplifier 395 has a first terminal, a second terminal, and a third terminal. The first terminal of the amplifier 395 is coupled to the transistors 310, 330 and the resistor 345. The second terminal of the amplifier 395 is coupled to the current source circuitry 375, the transistors 380, 385, and the resistor 390. The third terminal of the amplifier 395 is coupled to the output of the envelope detector circuitry 300, which supplies the envelope voltage signal to downstream circuitry.

In the example of FIG. 3, the transistors 310, 330, 350, 380, 385 are n-channel metal-oxide semiconductor field-effect transistors (MOSFETs). Alternatively, the transistors 310, 330, 350, 380, 385 may be n-channel field-effect transistors (FETs), n-channel insulated-gate bipolar transistors (IGBTs), n-channel junction field effect transistors (JFETs), NPN bipolar junction transistors (BJTs) or, with slight modifications, p-type equivalent devices. The transistors 310, 330, 350, 380, 385 may be depletion mode devices, drain-extended devices, enhancement mode devices, natural transistors, or other types of device structure transistors. Furthermore, the transistors 310, 330, 350, 380, 385 may be implemented in/over a silicon substrate (Si), a silicon carbide substrate (SiC), a gallium nitride substrate (GaN) or a gallium arsenide substrate (GaAs).

Example operations of the envelope detector circuitry 300 are further illustrated and described in connection with FIG. 5. Advantageously, the reference circuitry 230 generates the reference voltage responsive to the drive voltages of the transistors 310, 330. Advantageously, the reference circuitry 230 adjusts the reference voltage to track shifts in the common mode voltage of the plus and minus receive signals. Advantageously, tracking shifts in the common mode voltage of the plus and minus receive signals using the reference voltage improves CMRR.

Figure 4A:
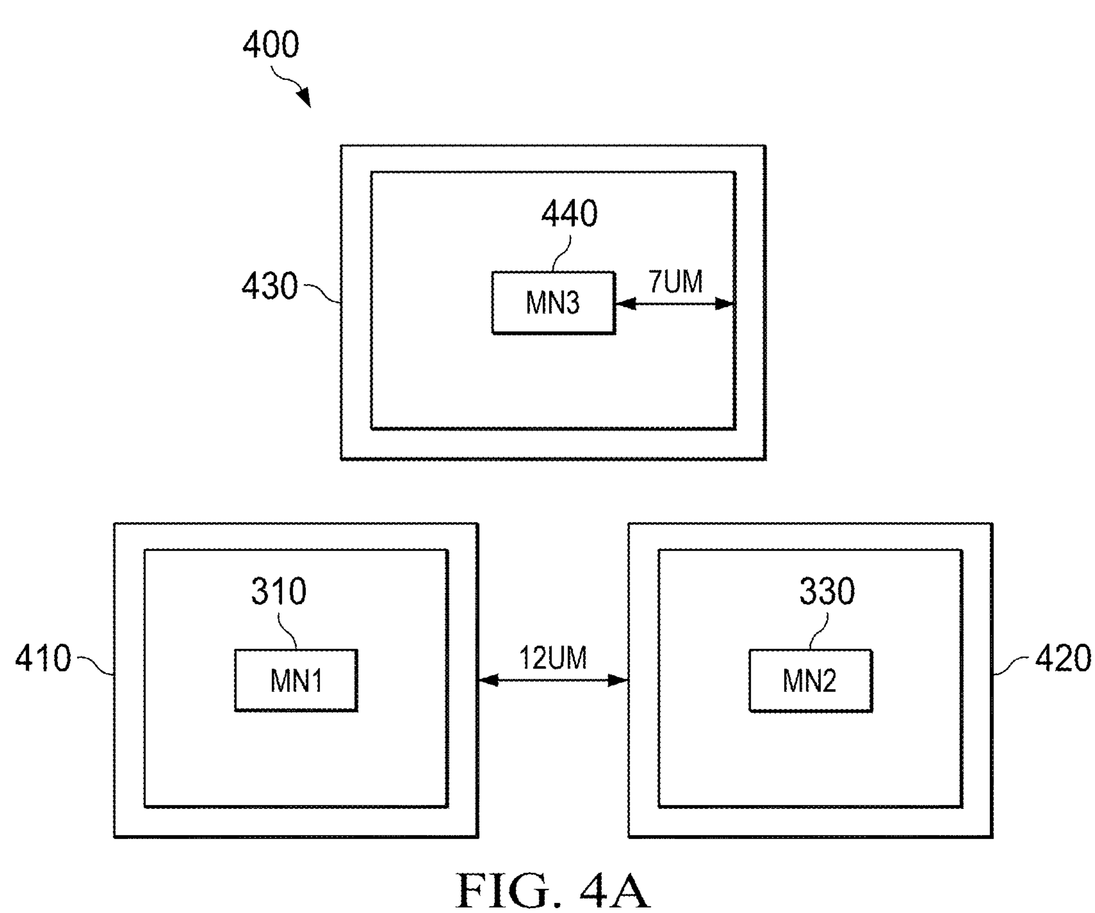
FIG. 4A is a block diagram of an example die having example transistors of the rectifier circuitry of FIG. 3 and the reference circuitry of FIG. 3 implemented using first, second, and third die regions.

FIG. 4A is a block diagram of an example die 400 illustrating a placement of the transistors 310, 330 of FIG. 3. The example die 400 of FIG. 4A includes a first example die region 410, a second example die region 420, and a third example die region 430. The example die region 410 of FIG. 4A includes the transistor 310. The example die region 420 of FIG. 4A includes the transistor 330. The example die region 430 of FIG. 4A includes an example transistor 440.

The die 400 of FIG. 4A illustrates an example implementation of the envelope detector circuitry 150 of FIG. 1 including reference circuitry, such as the reference circuitry 230 of FIGS. 2 and 3, having transistors with bulk terminals biased to a first voltage. For example, the die 400 illustrates as if the third terminal of one of the transistors 380, 385 of FIG. 3 are biased to the common potential. In the example of FIG. 4A, the die region 410 provides support for the transistor 310 responsive to forming a bulk region coupled to the fourth output of the rectifier circuitry 210, which supplies the second minus driver voltage (VM2). Similarly, the die region 420 provides support for the transistor 330 responsive to forming a bulk region coupled to the second output of the rectifier circuitry 210, which supplies the second plus driver voltage (VP2). However, the die region 430 provides support for the transistor 440 responsive to the bulk terminal of the transistor 440 being coupled to a different bias voltage, such as the common potential. Such an additional die region allows the reference circuitry 230 to include transistors biased to different potentials.

Figure 4B:
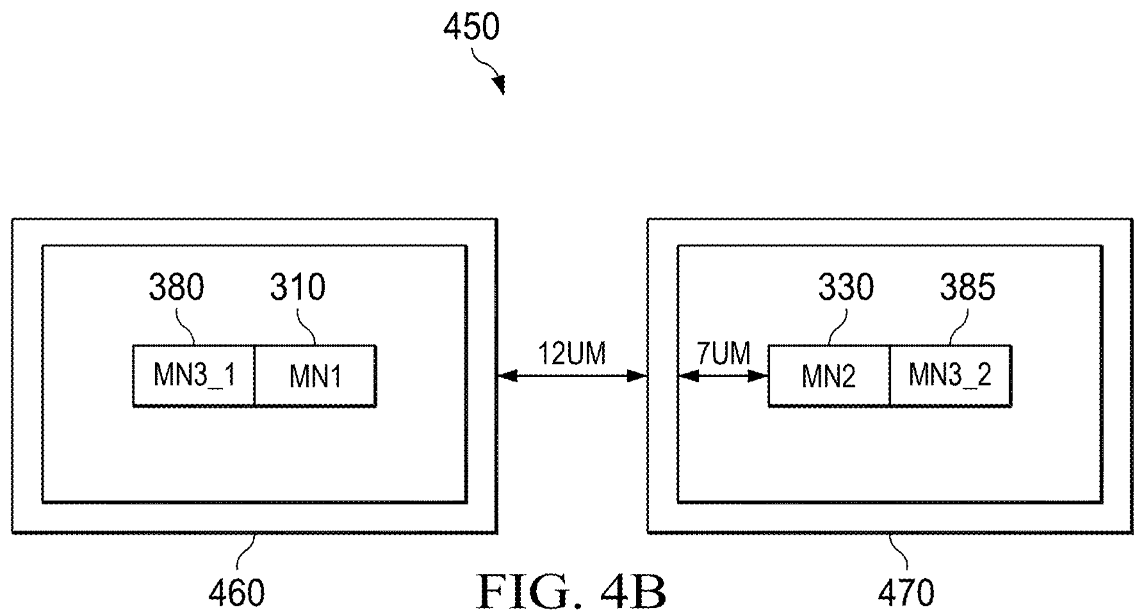
FIG. 4B is a block diagram of an example die having example transistors of the rectifier circuitry of FIG. 3 and the reference circuitry of FIG. 3 implemented using the first and second dies regions of FIG. 4A.

FIG. 4B is a block diagram of an example die 450 illustrating a placement of the transistors 310, 330, 380, 385 of FIG. 3. The example die 450 of FIG. 4B includes a first example die region 460 and a second example die region 470. The example die region 460 of FIG. 4B includes the transistors 310, 380. The example die region 470 of FIG. 4B includes the transistors 330, 385.

The die 450 of FIG. 4B illustrates an example implementation of the transistors 310, 330, 380, 385 as illustrated in FIG. 3. In the example of FIG. 3, the transistors 310, 380 (MN1, MN3_1) have bulk terminals coupled to the fourth output of the rectifier circuitry 210, which supplies the second minus driver voltage. The die region 460 provides support for the transistors 310, 380 responsive to forming a bulk region coupled to fourth output of the rectifier circuitry 210, which supplies the second minus driver voltage. Similarly, the transistors 330, 385 (MN2, MN3_2) have bulk terminals coupled to the second output of the rectifier circuitry 210, which supplies the second plus driver voltage. The die region 470 provides support for the transistors 330, 385 responsive to forming a bulk region coupled to second output of the rectifier circuitry 210, which supplies the second plus driver voltage. Advantageously, structuring the transistors 380, 385 of the reference circuitry 230 to share connections with the transistors 310, 330 of the rectifier circuitry 210 reduces the number of individual die regions needed to implement the envelope detector circuitry 150, 200, 300. Advantageously, reducing the number of die regions needed to implement the envelope detector circuitry 150, 200, 300 reduces the system-on-chip (SoC) size.

Figure 5:
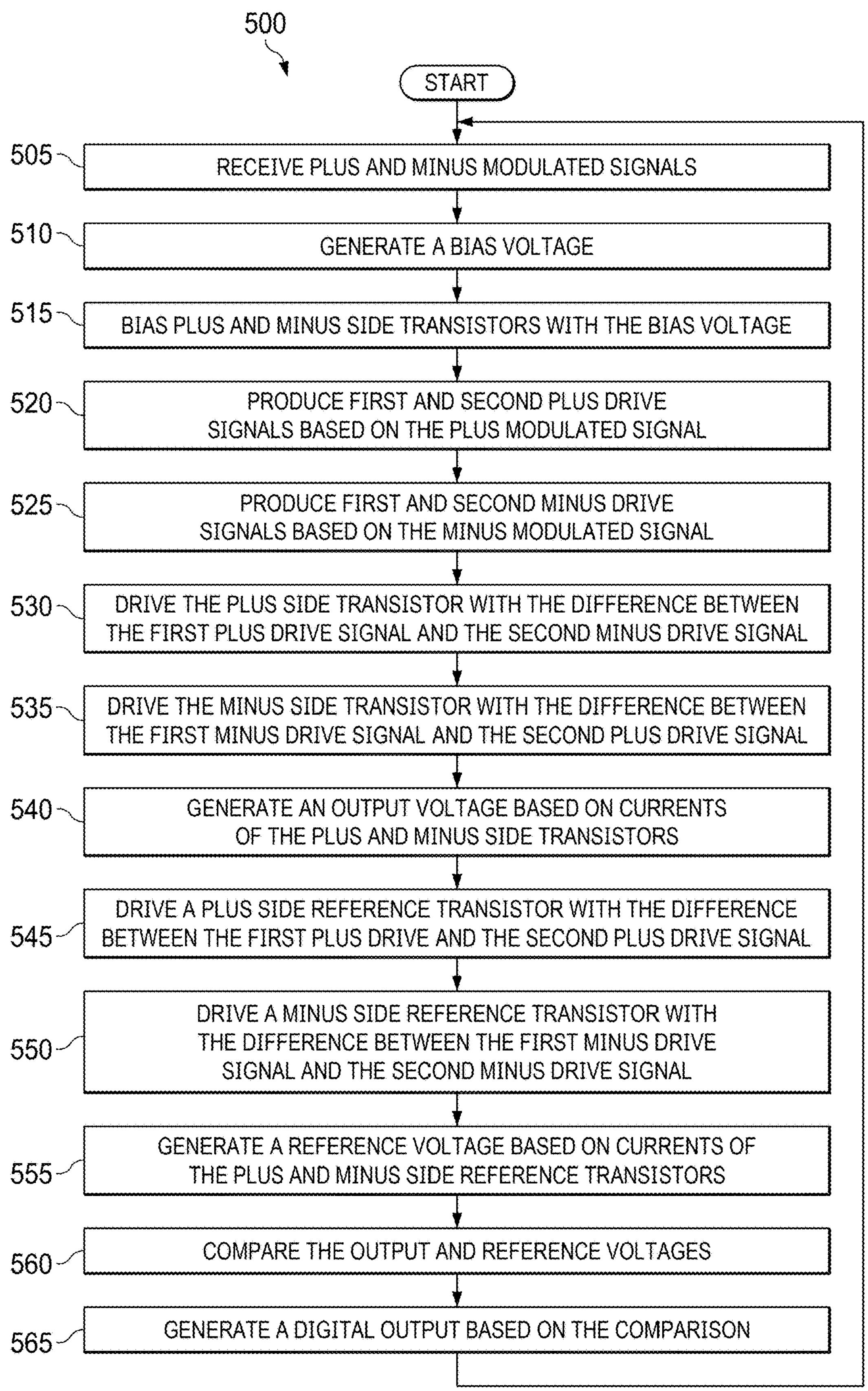
FIG. 5 is a flowchart representative of example machine-readable instructions or example operations that may be at least one of executed, instantiated, or performed using example implementations of the rectifier circuitry of FIG. 3 and the reference circuitry of FIG. 3, or more generally the envelope detector circuitry of FIGS. 1, 2, and 3.

FIG. 5 is a flowchart representative of example machine-readable instructions or example operations 500 that may be at least one of executed, instantiated, or performed using example implementations of the rectifier circuitry 210 of FIGS. 2 and 3, the reference circuitry 230 of FIGS. 2 and 3, or more generally the envelope detector circuitry 150, 200, 300 of FIGS. 1, 2, and 3. The example operations 500 of FIG. 5 begin at Block 505, at which the envelope detector circuitry 150, 200, 300 receives plus and minus modulated signals. In some examples, the transmitter circuitry 105 of FIG. 1 uses OOK modulation to modulate a digital signal using a sinusoidal carrier signal. In such examples, the receiver circuitry 115 of FIG. 1 receives the modulated signal responsive to traversing the isolation transformer 110 of FIG. 1. In example operations, the envelope detector circuitry 150, 200, 300 receives the plus receive signal (VP) and the minus receive signal (VM) as a differential pair of signals representing the modulated signal.

The bias circuitry 220 of FIGS. 2 and 3 generates a bias voltage. (Block 510). In example operation, the transistor 350 of FIG. 3 and the resistor 355 of FIG. 3 are structured as a voltage source circuitry. In such example operations, the transistor 350 supplies a bias voltage (VBIAS), which is proportional to the bias current (BIAS) and the resistance of the resistor 355, to the resistors 365, 370 of FIG. 3.

The resistors 365, 370 of FIG. 3 bias plus and minus side transistors with the bias voltage. (Block 515). In some examples, the resistors 365, 370 couple the bias voltage the transistor 310, 330 of FIG. 3. In example operations, the plus and minus modulated signal represent logic zeros with a lack of the carrier signal, during such times, the bias voltage drives the transistors 310, 330. In such example operations, the transistors 310, 330 conduct a current approximately equal to the bias current at the bias terminal responsive to the bias voltage and a lack of an oscillating carrier signal at the first and second inputs of the envelope detector circuitry 150, 200, 300. Advantageously, adjusting the bias current at the bias terminal shifts the output voltage of the rectifier circuitry 210 during portions of the modulated signal representing logic zeros.

The capacitors 305, 335 of FIG. 3 produce first and second plus drive signals based on the plus modulated signal. (Block 520). In example operations, the capacitor 305 filters (also referred to as removes, blocks, etc.) direct current (DC) offset of the plus receive signal to produce the first plus drive signal (VP1). Similarly, the capacitor 335 filters DC offset of the plus receive signal to produce the second plus drive signal (VP2). Advantageously, the capacitors 305, 335 increase the common mode rejection ratio (CMRR) of the envelope detector circuitry 150, 200, 300 responsive to filtering DC offset of the plus receive signal.

The capacitors 315, 325 of FIG. 3 produce first and second minus drive signals based on the plus modulated signal. (Block 525). In example operations, the capacitor 315 filters (also referred to as removes, blocks, etc.) DC offset of the minus receive signal to produce the first minus drive signal (VM1). Similarly, the capacitor 325 filters DC offset of the minus receive signal to produce the second minus drive signal (VM2). Advantageously, the capacitors 315, 325 increase the CMRR of the envelope detector circuitry 150, 200, 300 responsive to filtering DC offset of the minus receive signal.

The capacitors 305, 315 drive the plus side transistor with the difference between the first plus drive signal and the second minus drive signal. (Block 530). In example operations, the capacitors 305, 315 set the gate-to-source voltage of the transistor 310 equal to the difference between the first plus drive signal and the second minus drive signal. In such example operations, the transistor 310 conducts current responsive to a positive difference between the plus and minus receive signals. For example, the transistor 310 conducts current during positive magnitudes of the modulated signal.

The capacitors 325, 335 drive the minus side transistor with the difference between the first minus drive signal and the second plus drive signal. (Block 535). In example operations, the capacitors 325, 335 set the gate-to-source voltage of the transistor 330 equal to the difference between the first minus drive signal and the second plus drive signal. In such example operations, the transistor 330 conducts current responsive to a negative difference between the plus and minus receive signals. For example, the transistor 330 conducts current during negative magnitudes of the modulated signal.

The resistors 320, 340, 345 of FIG. 3 generate an output voltage based on currents of the plus and minus side transistors. (Block 540). In example operations, the resistor 320 sets the output voltage (VOUT) of the rectifier circuitry 210 responsive to the transistor 310 conducting current. For example, the resistor 320 sets the output voltage during positive magnitudes of the modulated signal. Similarly, the resistor 340 sets the output voltage of the rectifier circuitry 210 responsive to the transistor 330 conducting current. For example, the resistor 340 sets the output voltage responsive to negative magnitudes of the modulated signal.

The capacitors 305, 335 drive a plus side reference transistor with the difference between the first and second plus drive signals. (Block 545). In some examples, the capacitors 305, 335 set the gate-to-source voltage of the transistor 385 equal to the difference between the first plus drive signal and the second plus drive signal. In example operations, the resistor 340 increases the second plus drive signal responsive to the transistor 330 conducting current. In such example operations, the first and second plus drive signals adjust the conduction of current by the transistor 385 responsive to the transistor 330 conducting current.

The capacitors 315, 325 drive a minus side reference transistor with the difference between the first and second minus drive signals. (Block 550). In some examples, the capacitors 315, 325 set the gate-to-source voltage of the transistor 380 equal to the difference between the first minus drive signal and the second minus drive signal. In example operations, the resistor 320 increases the second minus drive signal responsive to the transistor 310 conducting current. In such example operations, the first and second minus drive signals adjust the conduction of current by the transistor 380 responsive to the transistor 310 conducting current.

The current source circuitry 375 of FIG. 3 and the transistors 380, 385 generate a reference voltage based on currents of the plus and minus side reference transistors. (Block 555). In some examples, the current source circuitry 375 sinks current from the supply terminal through the resistor 390 of FIG. 3 to set the reference voltage to an initial voltage. In example operations, the transistors 380, 385 pull up the reference voltage responsive to one of the transistors 310, 330 conducting current. In such example operations, conduction of the transistors 380, 385 decreases responsive to the conduction of the transistors 310, 330 increasing the voltages at the bulk terminals of the transistors 380, 385. Advantageously, the reference voltage tracks the output voltage responsive to the transistors 380, 385 conducting current based on currents from the transistors 310, 330. Advantageously, setting the reference voltage based on the output voltage improves CMRR.

The comparator circuitry 240 of FIGS. 2 and 3 compares the output and reference voltages. (Block 560). In example operations, the amplifier 395 of FIG. 3 subtracts the output voltage from the reference voltage to produce a comparison voltage. In such examples, the comparison voltage is a single ended voltage that the amplifier 395 compares to a threshold voltage.

The comparator circuitry 240 generates a digital output based on the comparison. (Block 565). In example operations, the amplifier 395 generates a digital output responsive to a comparison of the comparison voltage to the threshold voltage. In such examples, the digital output is a logic one responsive to the comparison voltage being greater than the threshold voltage and a logic zero responsive to the comparison voltage being less than the threshold voltage. Advantageously, the comparator circuitry 240 produces a digital output based on the output voltage and the reference voltage.

Example methods are described with reference to the flowchart illustrated in FIG. 5. However, many other methods of implementing the rectifier circuitry 210 of FIGS. 2 and 3, the reference circuitry 230 of FIGS. 2 and 3, or more generally the envelope detector circuitry 150, 200, 300 of FIGS. 1, 2, and 3 may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

Figure 6:
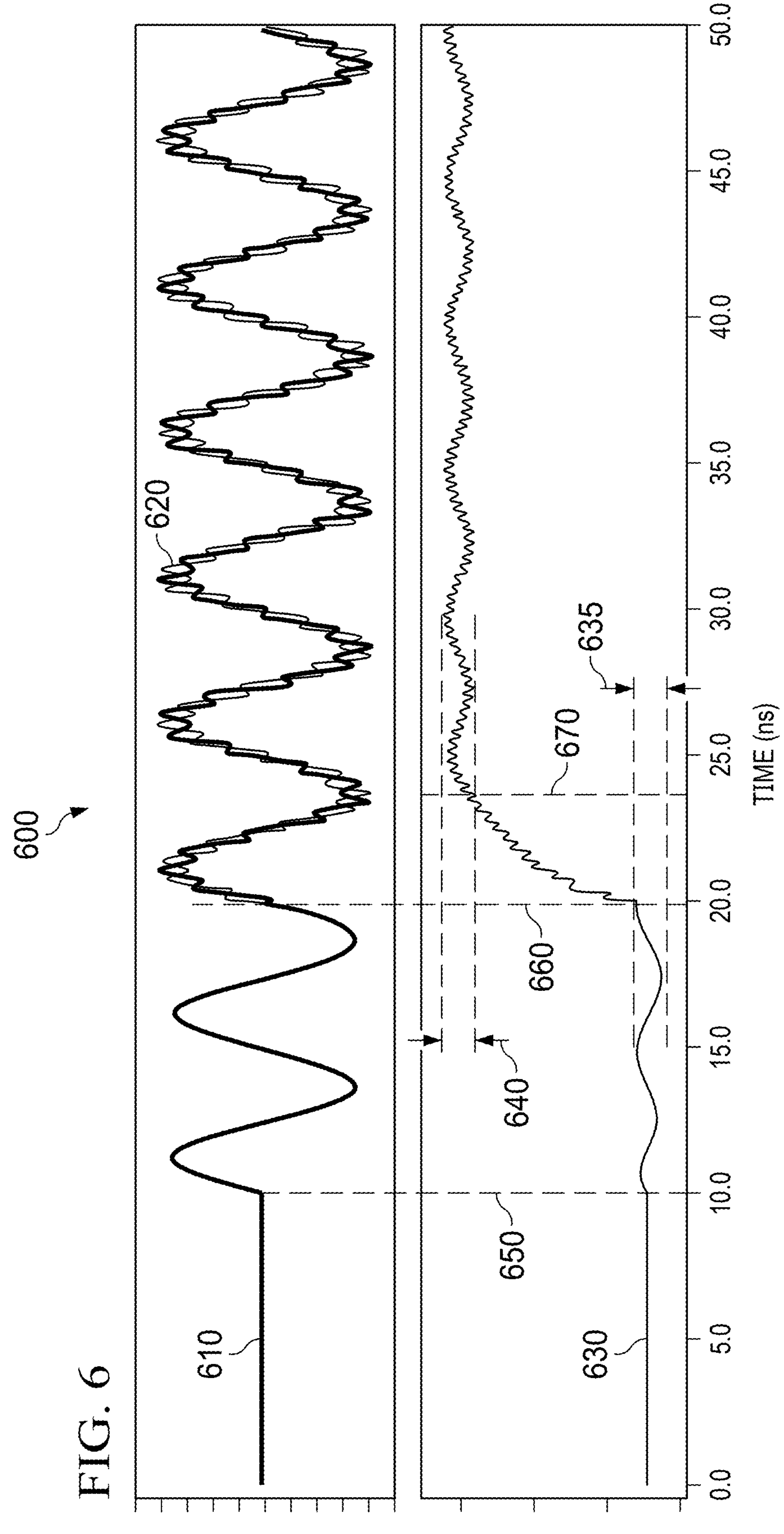
FIG. 6 is a timing diagram of example operations of the rectifier circuitry of FIG. 3 or more generally the envelope detector circuitry of FIGS. 1, 2, and 3.

FIG. 6 is a timing diagram 600 of example operations of the rectifier circuitry 210 of FIGS. 2 and 3 or more generally the envelope detector circuitry 150, 200, 300 of FIGS. 1, 2, and 3. In the example of FIG. 6, the timing diagram 600 includes an example plus receive signal 610 (VP), an example minus receive signal 620 (VM), and an example comparison voltage 630 (VREF-VOUT). The plus and minus receive signals 610, 620 represent the modulated signal received by the inductor 145 of FIG. 1. The comparison voltage 630 represents the difference between the reference voltage (VREF) from the reference circuitry 230 of FIGS. 2 and 3 and the output voltage (VOUT) from the rectifier circuitry 210.

In the example operations of FIG. 6, the comparison voltage has a reference peak-to-peak amplitude 635 and a shifted peak-to-peak amplitude 640. The reference peak-to-peak amplitude 635 illustrates the oscillation of the comparison voltage 630 responsive to common mode noise, which is applied at a first time 650. Between the first time 650 and a second time 660, the plus and minus receive signals 610, 620 are driven by common mode noise, which equally affects both signals. At the second time 660, a differential voltage between the plus and minus receive signals 610, 620 begins to drive the transistors 310, 330 of FIG. 3. Between the second time 660 and a third time 670, the transistors 310, 330 and the resistors 320, 340 of FIG. 3 drive the output voltage of the rectifier circuitry 210 to shift the common mode voltage of the comparison voltage 630. At the third time 670, the comparison voltage 630 has a common mode voltage substantially greater than the common mode voltage prior to the second time 660. Advantageously, the comparator circuitry 240 of FIGS. 2 and 3 may accurately demodulate the plus and minus receive signals 610, 620 with a threshold voltage between the peak-to-peak amplitude 635 and the shifted peak-to-peak amplitude 640.

Figure 7:
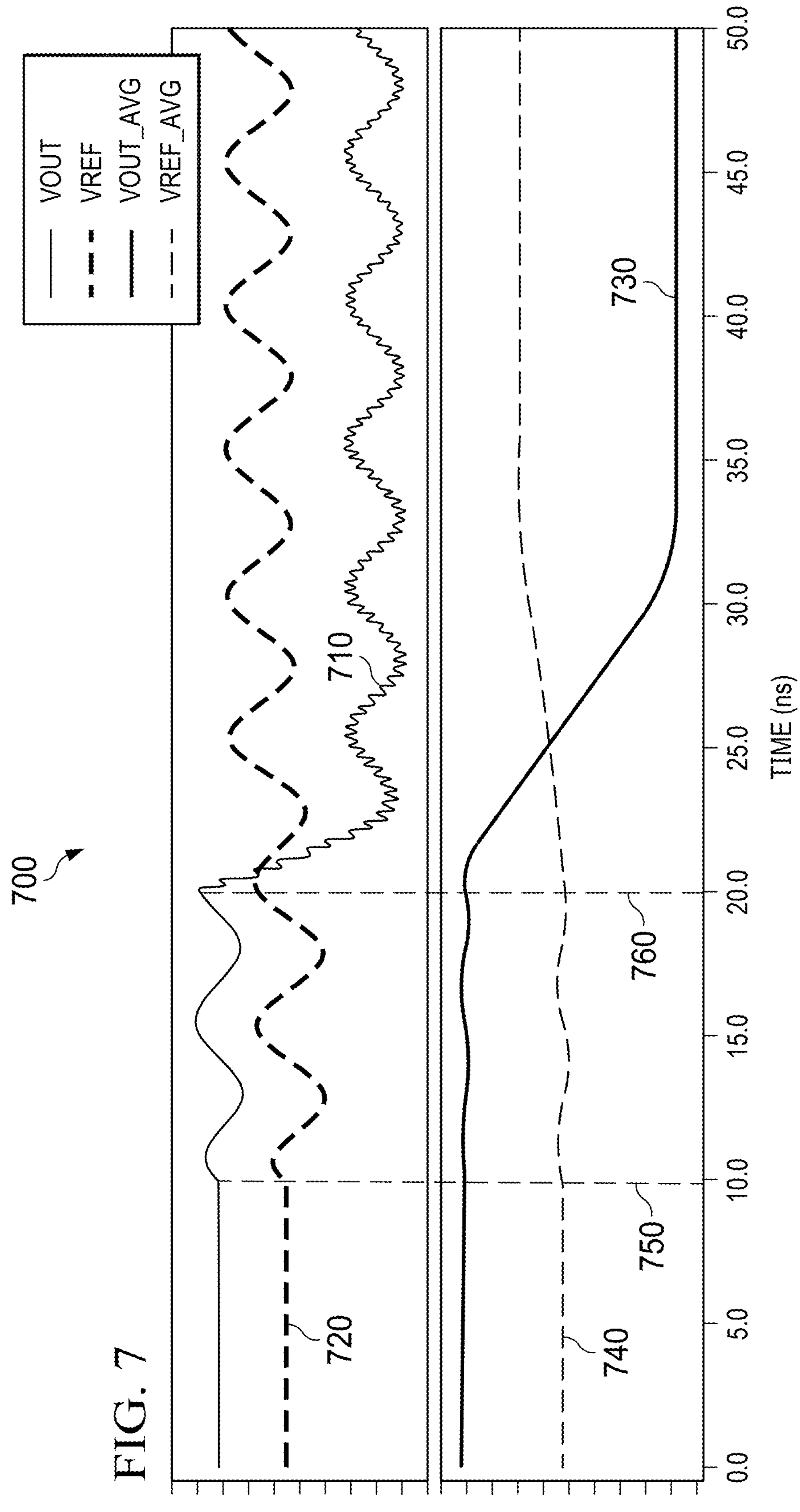
FIG. 7 is a timing diagram of example operations of the rectifier circuitry of FIG. 3 and the reference circuitry of FIG. 3, or more generally the envelope detector circuitry of FIGS. 1, 2, and 3.

FIG. 7 is a timing diagram 700 of example operations of the rectifier circuitry 210 of FIGS. 2 and 3 and the reference circuitry 230 of FIGS. 2 and 3, or more generally the envelope detector circuitry 150, 200, 300 of FIGS. 1, 2, and 3. In the example of FIG. 7, the timing diagram 700 includes an example output voltage 710 (VOUT), an example reference voltage 720 (VREF), an example average output voltage 730 (VOUT_AVG), and an example average reference voltage 740 (VREF_AVG). The output voltage 710 represents the output of the rectifier circuitry 210 over time. The reference voltage 720 represents the output of the reference circuitry 230 over time. The average output voltage 730 represents the common mode voltage of the output voltage 710 over time. The average reference voltage 740 represents the common mode voltage of the reference voltage 720 over time.

At a first time 750, example common mode noise is applied to the plus and minus receive signals at the inputs of the envelope detector circuitry 150, 200, 300. Between the first time 750 and a second time 760, the output voltage 710 and the reference voltage 720 track the common mode noise equally. Similarly, the average output voltage 730 and the average reference voltage 740 reject the added common mode noise. At the second time 760, the plus and minus receive signals are driven by a carrier signal. At the second time 760, a conduction of current through the transistors 310, 330 of FIG. 3 and the resistors 320, 340 of FIG. 3 pull down the average output voltage 730. Similarly, the conduction of current through the transistor 310, 330 causes the resistors 320, 340 to increase the second plus and minus drive voltages, which reduces the conduction of current through the transistors 380, 385 of FIG. 3. Such a reduction in the current by the transistors 380, 385 allows the resistor 390 to pull up the reference voltage 720. Advantageously, the average reference voltage 740 increases as the average output voltage 730 decreases. Advantageously, such an increase in the difference between the average reference voltage 740 and the average output voltage 730 produces a relatively larger shift on the comparison voltage (e.g., the comparison voltage 630 of FIG. 6). Advantageously, increasing the shift of the comparison voltage improves the CMRR of the envelope detector circuitry 150, 200, 300.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and things, the phrase "at least one of A and B" refers to implementations including any of (1) at least one A, (2) at least one B, or (3) at least one A and at least one B. Similarly, as used herein in the context of describing structures, components, items, objects and things, the phrase "at least one of A or B" refers to implementations including any of (1) at least one A, (2) at least one B, or (3) at least one A and at least one B. As used herein in the context of describing the performance or execution of processes, instructions, actions, activities, etc., the phrase "at least one of A and B" refers to implementations including any of (1) at least one A, (2) at least one B, or (3) at least one A and at least one B. Similarly, as used herein in the context of describing the performance or execution of processes, instructions, actions, activities, etc., the phrase "at least one of A or B" refers to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is at least one of not feasible or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of referencing at least one of a semiconductor device (e.g., a transistor), a semiconductor die containing a semiconductor device, or an integrated circuit (IC) package containing a semiconductor die during fabrication or manufacturing, "above" is not with reference to Earth, but instead is with reference to an underlying substrate on which relevant components are fabricated, assembled, mounted, supported, or otherwise provided. Thus, as used herein and unless otherwise stated or implied from the context, a first component within a semiconductor die (e.g., a transistor or other semiconductor device) is "above" a second component within the semiconductor die when the first component is farther away from a substrate (e.g., a semiconductor wafer) during fabrication/manufacturing than the second component on which the two components are fabricated or otherwise provided. Similarly, unless otherwise stated or implied from the context, a first component within an IC package (e.g., a semiconductor die) is "above" a second component within the IC package during fabrication when the first component is farther away from a printed circuit board (PCB) to which the IC package is to be mounted or attached. Semiconductor devices are often used in orientation different than their orientation during fabrication. Thus, when referring to one of or a combination of a semiconductor device (e.g., a transistor), a semiconductor die containing a semiconductor device, or an integrated circuit (IC) package containing a semiconductor die during use, the definition of "above" in the preceding paragraph (i.e., the term "above" describes the relationship of two parts relative to Earth) will likely govern based on the usage context.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by at least one of the connection reference or relative movement between those elements unless otherwise indicated. As such, connection references do not necessarily infer that two elements are directly connected or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, or ordering in any way, but are merely used as at least one of labels or arbitrary names to distinguish elements for ease of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to at least one of manufacturing tolerances or other real-world imperfections. For example, "approximately" and "about" may indicate such dimensions may be within a tolerance range of +/−10% unless otherwise specified herein.

As used herein, the phrase "in communication," including variations thereof, encompasses one of or a combination of direct communication or indirect communication through one or more intermediary components, and does not require direct physical (e.g., wired) communication or constant communication, but rather also includes selective communication at least one of periodic intervals, scheduled intervals, aperiodic intervals, or one-time events.

As used herein, "programmable circuitry" is defined to include at least one of (i) one or more special purpose electrical circuits (e.g., an application specific circuit (ASIC)) structured to perform specific operation(s) and including one or more semiconductor-based logic devices (e.g., electrical hardware implemented by one or more transistors), or (ii) one or more general purpose semiconductor-based electrical circuits programmable with instructions to perform one or more specific functions(s) or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations or functions, Field Programmable Gate Arrays (FPGAs) that may be programmed with second instructions to at least one of configure or structure the FPGAs to instantiate one or more operations or functions corresponding to the first instructions, Graphics Processor Units (GPUs) that may execute first instructions to perform one or more operations or functions, Digital Signal Processors (DSPs) that may execute first instructions to perform one or more operations or functions, XPUs, Network Processing Units (NPUs) one or more microcontrollers that may execute first instructions to perform one or more operations or functions or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein, integrated circuit/circuitry is defined as one or more semiconductor packages containing one or more circuit elements such as transistors, capacitors, inductors, resistors, current paths, diodes, etc. For example, an integrated circuit may be implemented as one or more of an ASIC, an FPGA, a chip, a microchip, programmable circuitry, a semiconductor substrate coupling multiple circuit elements, a system on chip (SoC), etc.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., at least one of programmed or hardwired) at a time of manufacturing by a manufacturer to at least one of perform the function or be configurable (or re-configurable) by a user after manufacturing to perform the function/or other additional or alternative functions. The configuring may be through at least one of firmware or software programming of the device, through at least one of a construction or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

In the description and claims, described "circuitry" may include one or more circuits. A circuit or device that is described herein as including certain components may instead be adapted to be coupled to those components to form the described circuitry or device. For example, a structure described as including one or more semiconductor elements (such as transistors), one or more passive elements (such as one of or a combination of resistors, capacitors, or inductors), or one or more sources (such as voltage and/or current sources) may instead include only the semiconductor elements within a single physical device (e.g., at least one of a semiconductor die or integrated circuit (IC) package) and may be adapted to be coupled to at least some of the passive elements or the sources to form the described structure either at a time of manufacture or after a time of manufacture, for example, by at least one of an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in at least one of series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and some features illustrated as being internal to the integrated circuit may be incorporated outside of the integrated. As used herein, the term "integrated circuit" means one or more circuits that are at least one of: (i) incorporated in/over a semiconductor substrate; (ii) incorporated in a single semiconductor package; (iii) incorporated into the same module; or (iv) incorporated in/on the same printed circuit board.

Uses of the phrase "ground" in the foregoing description include at least one of a chassis ground, an Earth ground, a floating ground, a virtual ground, a digital ground, a common ground, or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero.

Modifications are possible in the described embodiments, and other embodiments are possible, within the scope of the claims.

What is claimed is:

1. An apparatus comprising:

rectifier circuitry including:

a first resistor having a terminal;

a second resistor having a terminal;

a first transistor having a first terminal, a second terminal, and a control terminal; and a second transistor having a first terminal, a second terminal, and a control terminal;

reference circuitry having a first input, a second input, a third input, a fourth input, and an output, the first input of the reference circuitry coupled to the control terminal of the first transistor, the second input of the reference circuitry coupled to the terminal of the second resistor and first terminal of the second transistor, the third input of the reference circuitry coupled to the control terminal of the second transistor, the fourth input of the reference circuitry coupled to the terminal of the first resistor and the first terminal of the first transistor; and comparator circuitry having a first input and a second input, the first input of the comparator circuitry coupled to the second terminal of the first transistor and the second terminal of the second transistor, the second input of the comparator circuitry coupled to the output of the reference circuitry.

2. The apparatus of claim 1, wherein the rectifier circuitry further includes:

a first capacitor having a first terminal and a second terminal, the first terminal of the first capacitor coupled to the control terminal of the first transistor and the first input of the reference circuitry;

a second capacitor having a first terminal and a second terminal, the first terminal of the second capacitor coupled to the terminal of the first resistor, the first terminal of the first transistor, and the fourth input of the reference circuitry;

a third capacitor having a first terminal and a second terminal, the first terminal of the third capacitor coupled to the control terminal of the second transistor and the third input of the reference circuitry, the second terminal of the third capacitor coupled to the second terminal of the second capacitor; and a fourth capacitor having a first terminal and a second terminal, the first terminal of the fourth capacitor coupled to the terminal of the second resistor, the first terminal of the second transistor, and the second input of the reference circuitry, the second terminal of the fourth capacitor coupled to the second terminal of the first capacitor.

3. The apparatus of claim 1, wherein the reference circuitry includes:

current source circuitry having a terminal;

a third transistor having a first terminal, a second terminal, and a control terminal, the first terminal of the third transistor coupled to the terminal of the first resistor and the first terminal of the first transistor, the control terminal of the third transistor coupled to the control terminal of the second transistor; and a fourth transistor having a first terminal, a second terminal, and a control terminal, the first terminal of the fourth transistor coupled to the terminal of the second resistor and the first terminal of the second transistor, the second terminal of the fourth transistor coupled to the second input of the comparator circuitry, the terminal of the current source circuitry, and the second terminal of the third transistor, the control terminal of the fourth transistor coupled to the control terminal of the first transistor.

4. The apparatus of claim 3, wherein the first transistor further has a bulk terminal, the second transistor further has a bulk terminal, the third transistor further has a bulk terminal coupled to the terminal of the first resistor, the first terminal of the first transistor, the bulk terminal of the first transistor, and the first terminal of the third transistor, the fourth transistor further has a bulk terminal coupled to the terminal of the second resistor, the first terminal of the second transistor, the bulk terminal of the second transistor, and the first terminal of the fourth transistor.

5. The apparatus of claim 1, further comprising bias circuitry having a first output and a second output, the first output of the bias circuitry coupled to the control terminal of the first transistor and the first input of the reference circuitry, the second output of the bias circuitry coupled to the control terminal of the second transistor and the third input of the reference circuitry.

6. The apparatus of claim 5, wherein the bias circuitry includes:

a third transistor having a first terminal and a control terminal;

a third resistor having a first terminal and a second terminal, the first terminal of the third resistor coupled to the control terminal of the first transistor and the first input of the reference circuitry; and a fourth resistor having a first terminal and a second terminal, the first terminal of the fourth resistor coupled to the control terminal of the second transistor and the third input of the reference circuitry, the second terminal of the fourth resistor is coupled to the first terminal of the third transistor, the control terminal of the third transistor, and the second terminal of the third resistor.

7. The apparatus of claim 1, further comprising:

transmitter circuitry having a first output and a second output; and transformer circuitry having a first terminal, a second terminal, a third terminal, and a fourth terminal, the first terminal of the transformer circuitry coupled to the first output of the transmitter circuitry, the second terminal of the transformer circuitry coupled to the second output of the transmitter circuitry, the third terminal of the transformer circuitry coupled to the control terminal of the first transistor and the first input of the reference circuitry, the fourth terminal of the transformer circuitry coupled to the control terminal of the second transistor and the third input of the reference circuitry.

8. An apparatus comprising:

rectifier circuitry having a first output, a second output, a third output, a fourth output, and a fifth output;

reference circuitry including:

current source circuitry having a terminal;

a first transistor having a first terminal, a second terminal, and a control terminal, the first terminal of the first transistor coupled to the first output of the rectifier circuitry, the control terminal of the first transistor coupled to the second output of the rectifier circuitry; and a second transistor having a first terminal, a second terminal, and a control terminal, the first terminal of the second transistor coupled to the third output of the rectifier circuitry, the control terminal of the second transistor coupled to the fourth output of the rectifier circuitry; and comparator circuitry having a first input and a second input, the first input of the comparator circuitry coupled to the fifth output of the rectifier circuitry, the second input of the comparator circuitry coupled to the terminal of the current source circuitry, the second terminal of the first transistor, and the second terminal of the second transistor.

9. The apparatus of claim 8, wherein the rectifier circuitry includes:

a first resistor having a terminal;

a second resistor having a terminal;

a third transistor having a first terminal, a second terminal, and a control terminal, the first terminal of the third transistor coupled to the first terminal of the first transistor and the terminal of the first resistor, the control terminal of the third transistor coupled to the control terminal of the second transistor; and a fourth transistor having a first terminal, a second terminal, and a control terminal, the first terminal of the fourth transistor coupled to the first terminal of the second transistor and the terminal of the second resistor, the second terminal of the fourth transistor coupled to the first input of the comparator circuitry and the second terminal of the third transistor, the control terminal of the fourth transistor coupled to the control terminal of the first transistor.

10. The apparatus of claim 9, wherein the rectifier circuitry includes:

a first capacitor having a first terminal and a second terminal, the first terminal of the first capacitor coupled to the control terminal of the second transistor and the control terminal of the third transistor;

a second capacitor having a first terminal and a second terminal, the first terminal of the second capacitor coupled to the terminal of the first resistor, the first terminal of the first transistor, and the first terminal of the third transistor;

a third capacitor having a first terminal and a second terminal, the first terminal of the third capacitor coupled to the control terminal of the first transistor and the control terminal of the fourth transistor, the second terminal of the third capacitor coupled to the second terminal of the second capacitor; and a fourth capacitor having a first terminal and a second terminal, the first terminal of the fourth capacitor coupled to the first terminal of the second transistor, the terminal of the second resistor, and the first terminal of the fourth transistor, the second terminal of the fourth capacitor coupled to the second terminal of the first capacitor.

11. The apparatus of claim 9, wherein the first transistor further has a bulk terminal, the second transistor further has a bulk terminal, the third transistor further has a bulk terminal coupled to the terminal of the first resistor, the first terminal of the first transistor, the bulk terminal of the first transistor, and the first terminal of the third transistor, the fourth transistor further has a bulk terminal coupled to the terminal of the second resistor, the first terminal of the second transistor, the bulk terminal of the second transistor, and the first terminal of the fourth transistor.

12. The apparatus of claim 8, further comprising bias circuitry having a first output and a second output, the first output of the bias circuitry coupled to the second output of the rectifier circuitry and the control terminal of the first transistor, the second output of the bias circuitry coupled to the fourth output of the rectifier circuitry.

13. The apparatus of claim 12, wherein the bias circuitry includes:

a third transistor having a first terminal and a control terminal;

a third resistor having a first terminal and a second terminal, the first terminal of the third resistor coupled to the second output of the rectifier circuitry and the control terminal of the first transistor; and a fourth resistor having a first terminal and a second terminal, the first terminal of the fourth resistor coupled to the fourth output of the rectifier circuitry and the control terminal of the second transistor, the second terminal of the fourth resistor is coupled to the first terminal of the third transistor, the control terminal of the third transistor, and the second terminal of the third resistor.

14. The apparatus of claim 8, wherein the rectifier circuitry further has a first input and a second input, and the apparatus further comprising:

transmitter circuitry having a first output and a second output; and transformer circuitry having a first terminal, a second terminal, a third terminal, and a fourth terminal, the first terminal of the transformer circuitry coupled to the first output of the transmitter circuitry, the second terminal of the transformer circuitry coupled to the second output of the transmitter circuitry, the third terminal of the transformer circuitry coupled to the first input of the rectifier circuitry, the fourth terminal of the transformer circuitry coupled to the second input of the rectifier circuitry.

15. An apparatus comprising:

transmitter circuitry having a first output and a second output;

transformer circuitry having a first terminal, a second terminal, a third terminal, and a fourth terminal, the first terminal of the transformer circuitry coupled to the first output of the transmitter circuitry, the second terminal of the transformer circuitry coupled to the second output of the transmitter circuitry; and receiver circuitry including:

rectifier circuitry having a first input, a second input, a first output, a second output, and a third output, the first input of the rectifier circuitry coupled to the third terminal of the transformer circuitry, the second input of the rectifier circuitry coupled to the fourth terminal of the rectifier circuitry; and reference circuitry having a first input, a second input, and an output, the first input of the reference circuitry coupled to the first output of the rectifier circuitry, the second input of the reference circuitry coupled to the second output of the rectifier circuitry; and comparator circuitry having a first input and a second input, the first input of the comparator circuitry coupled to the third output of the rectifier circuitry, the second input of the comparator circuitry coupled to the output of the reference circuitry.

16. The apparatus of claim 15, wherein the rectifier circuitry includes:

a first capacitor having a first terminal and a second terminal, the first terminal of the first capacitor coupled to the third terminal of the transformer circuitry;

a second capacitor having a first terminal and a second terminal, the first terminal of the second capacitor coupled to the fourth terminal of the transformer circuitry; and a transistor having a first terminal, a second terminal, and a control terminal, the first terminal of the transistor coupled to the second terminal of the first capacitor and the first input of the reference circuitry, the second terminal of the transistor coupled to the first input of the comparator circuitry, the control terminal of the transistor coupled to the second terminal of the second capacitor and the second input of the reference circuitry.

17. The apparatus of claim 16, wherein the reference circuitry further has a third input and a fourth input, the transistor is a first transistor, and the rectifier circuitry further including:

a third capacitor having a first terminal and a second terminal, the first terminal of the third capacitor coupled to the fourth terminal of the transformer circuitry and the first terminal of the second capacitor;

a fourth capacitor having a first terminal and a second terminal, the first terminal of the fourth capacitor coupled to the third terminal of the transformer circuitry and the first terminal of the first capacitor; and a second transistor having a first terminal, a second terminal, and a control terminal, the first terminal of the second transistor coupled to the second terminal of the third capacitor and the third input of the reference circuitry, the second terminal of the second transistor coupled to the first input of the comparator circuitry and the second terminal of the first transistor, the control terminal of the second transistor coupled to the second terminal of the fourth capacitor and the fourth input of the reference circuitry.

18. The apparatus of claim 15, wherein the reference circuitry further has a third input and a fourth input, and the rectifier circuitry includes:

a first capacitor having a first terminal and a second terminal, the first terminal of the first capacitor coupled to the third terminal of the transformer circuitry;

a second capacitor having a first terminal and a second terminal, the first terminal of the second capacitor coupled to the fourth terminal of the transformer circuitry;

a first transistor having a first terminal, a second terminal, and a control terminal, the first terminal of the first transistor coupled to the first input of the reference circuitry, the control terminal of the first transistor coupled to the second input of the reference circuitry and the second terminal of the first capacitor; and a second transistor having a first terminal, a second terminal, and a control terminal, the first terminal of the second transistor coupled to the third input of the reference circuitry, the second terminal of the second transistor coupled to the first input of the comparator circuitry and the second terminal of the first transistor, the control terminal of the second transistor coupled to the fourth input of the reference circuitry and the second terminal of the second capacitor.

19. The apparatus of claim 15, wherein the reference circuitry includes:

current source circuitry having an input; and a transistor having a first terminal, a second terminal, and a control terminal, the first terminal of the transistor coupled to the first output of the rectifier circuitry, the second terminal of the transistor coupled to the second input of the comparator circuitry and the input of the current source circuitry, the control terminal of the transistor coupled to the second output of the rectifier circuitry.

20. The apparatus of claim 19, wherein the rectifier circuitry further has a fourth output and a fifth output, the transistor is a first transistor, and the reference circuitry includes a second transistor having a first terminal, a second terminal, and a control terminal, the first terminal of the second transistor coupled to the fourth output of the rectifier circuitry, the second terminal of the second transistor coupled to the second input of the comparator circuitry, the input of the current source circuitry, and the second terminal of the first transistor, the control terminal of the second transistor coupled to the fifth output of the rectifier circuitry.

21. The apparatus of claim 15, wherein the rectifier circuitry further includes a third input, and the apparatus further comprising bias circuitry including:

a transistor having a first terminal and a control terminal; and a resistor having a first terminal and a second terminal, the first terminal of the resistor coupled to the first terminal of the transistor and the control terminal of the transistor, the second terminal of the resistor coupled to the third input of the rectifier circuitry.

* * * * *